United States Patent
Cuevas

(10) Patent No.: US 6,469,494 B1
(45) Date of Patent: Oct. 22, 2002

(54) PROGRAMMABLE CONNECTOR

(75) Inventor: Peter P. Cuevas, Los Gatos, CA (US)

(73) Assignee: QualiTau, Inc., Sunnyvale, CA (US)

( * ) Notice: Subject to any disclaimer, the term of this patent is extended or adjusted under 35 U.S.C. 154(b) by 0 days.

(21) Appl. No.: 09/433,796

(22) Filed: Nov. 3, 1999

(51) Int. Cl.$^7$ .............................................. H01H 31/02
(52) U.S. Cl. ...................... 324/158.1; 29/847; 324/537
(58) Field of Search ......................... 340/550; 324/750, 324/537, 754, 755, 158.1; 29/847; 439/48, 44, 65

(56) References Cited

U.S. PATENT DOCUMENTS

| | | | | |
|---|---|---|---|---|
| 3,028,573 A | * | 4/1962 | Stoehr .......................... | 439/48 |
| 4,972,175 A | * | 11/1990 | MacPherson ............... | 340/550 |
| 5,999,097 A | * | 12/1999 | Liddle et al. ............... | 340/550 |

* cited by examiner

*Primary Examiner*—Michael Sherry
*Assistant Examiner*—Parresh Patel

(74) *Attorney, Agent, or Firm*—Burns, Doane, Swecker & Mathis

(57) ABSTRACT

A programmable connector for use with a burn-in tester for manufactured integrated circuits is provided with an array of programming regions which can be selectively activated and deactivated to accommodate a specific testing configuration depending on the type of IC being tested and on the type of test being performed. The activation process is achieved using a conductive solution, applied selectively to the programming regions from a hand-held pen-type implement. The solution dries following application and serves to close a circuit between two electrically isolated conductive portions of the programming region. The solution is removable, using a solvent or other material, deactivation of the programming region for re-configuring the programmable connector.

19 Claims, 4 Drawing Sheets

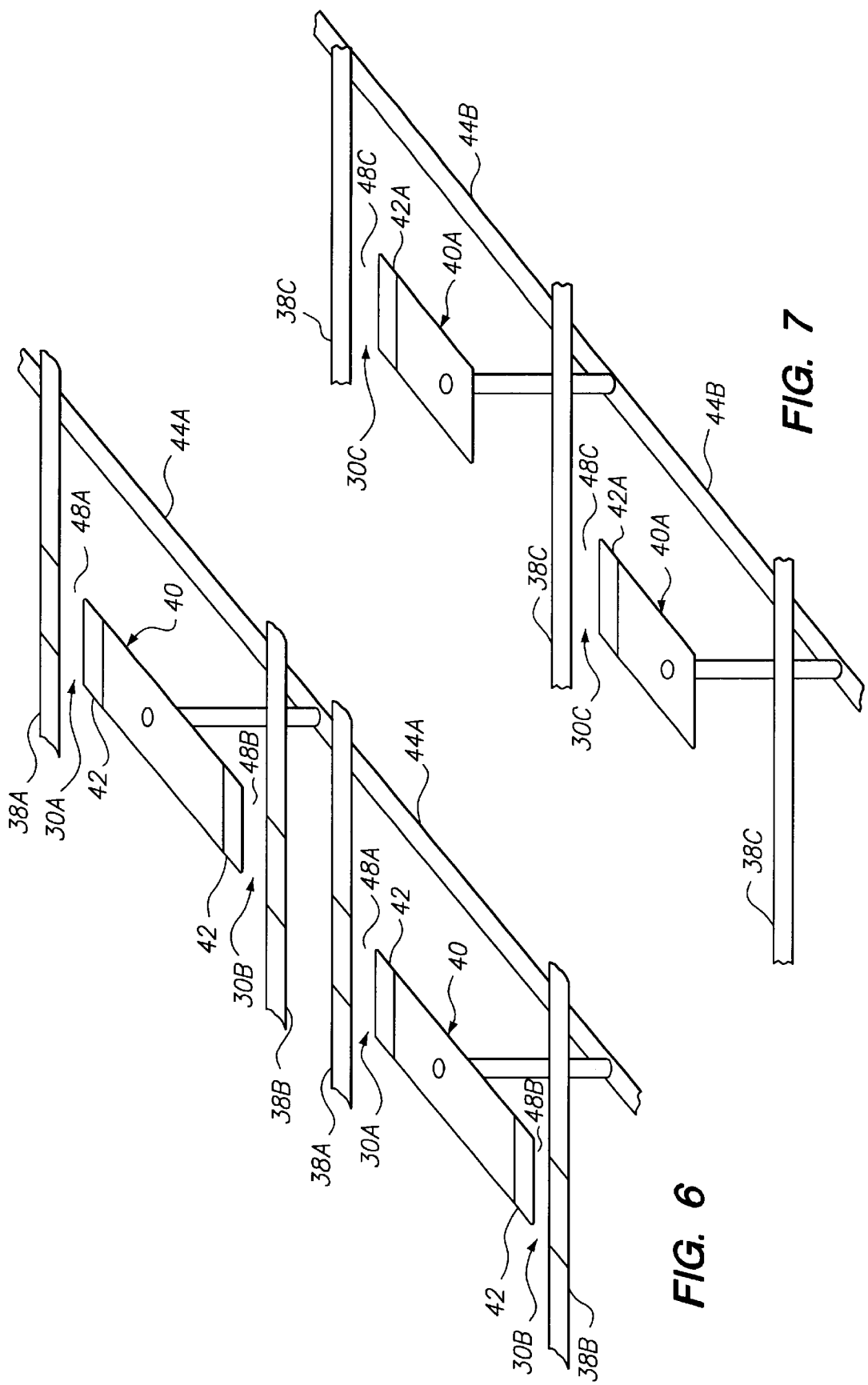

PROGRAMMABLE CONNECTOR

CROSS-REFERENCE TO RELATED APPLICATIONS (Not applicable)

BACKGROUND OF THE INVENTION

1. Field of the Invention

The invention relates to electrical devices, and more particularly, to programmable connectors for selectively connecting multiple circuits.

2. Description of Related Art

Following manufacture, integrated circuits are typically powered up and run for a test period prior to shipping to customers in order to weed out those devices which fail prematurely. This process is called burn-in and is typically performed at elevated temperatures to help accelerate early failures, or "infant mortalities." The burn-in system typically consists of a burn-in tester which provides the electrical test signals to the packaged integrated circuit, referred to as the device under test ("DUT"), and an oven which provides the temperature acceleration. The DUT is loaded into a load board and placed in the oven. The load board is constructed using conventional printed circuit board techniques and materials. Electrical test signals are routed from the burn-in tester through the load board to the appropriate terminals or pins of the DUT package.

Conventionally, there is a wide variety of types of integrated circuit packages and number of pins on each package. In addition, for a given package type and pin count there is an infinite number of products which can be housed inside it. This means the routing of the electrical test signals to the pins of the package presents an extremely large number of combinations. Historically, a separate load board has been made for each product, wherein the traces on the load board which carry the electrical test signals are routed to the specific pins, or leads, of the product. This is a "hard wired" design which does not allow for changes in the routing of the electrical test signals either to accommodate different devices to be tested or to perform different tests on a device. If the product pinout changes, a new load board must be manufactured to be able to burn it in. Likewise, a new load board needs to be manufactured for every new product.

Load boards are expensive and their wiring to the burn-in tester is labor intensive and time-consuming. Part of the expense is due to a robustness requirement, whereby the load boards need to be able to operate at elevated temperatures (up to 350° C. or more), provide little if any signal degradation and remain reliable for one to two years of continuous operation at the elevated temperatures. It therefore becomes important to minimize the need to replace load boards, to thereby reduce the production costs of integrated circuits. One way to minimize the need to replace load boards is to make them more versatile in their applicability.

Versatility can be achieved using a programmable connector which operates as a selectively configurable wiring interface between the load board on which the DUT is mounted and the burn-in tester. The programmable connector is thus designed to accommodate the electrical configuration of a variety of DUTs. Typically, the programmable connector employs a mechanical jumpering system, wherein transversely extending conductors are selectively connected to each other by placement of pins or other conducting bridges between them, as illustrated in FIG. 1. Conductors 12A and 12B are normally spaced apart and isolated from each other, for instance by an intervening insulating substrate 11 on which they are mounted in the programmable connector. One set of these conductors, 12A, is in electrical connection with the burn-in tester (not shown). The other set, 12B, is in electrical connection with the DUT (not shown). Programming the connector is effected using conducting pins 10 inserted in holes 16A formed on one side of the connector and holes 16B formed on the other side. The holes 16A and 16B are surrounded by conducting lands 18A and 18B, respectively, which are electrically contiguous with conductors 12A and 12B. When inserted in holes 16A and 16B, pins 10 make contact with the associated lands 18A and 18B and in this manner connect the corresponding connectors 12A and 12B. A plurality of pins 10 are used to make the connections required by the particular DUT and the test to be performed.

Other methods of selectively connecting a DUT to a burn-in testor are known. One known method uses an operationally similar scheme to that described above. Instead of holes, the connector is provided with arrays of header pins protruding outwardly from the programmable connector, each header pin being associated with a connector which is either in connection with the DUT or the burn-in testor. The header pins can be selectively shunted together to bridge the connection between the DUT and the burn-in tester in a selectively configurable manner.

The above prior art schemes suffer from several disadvantages, including those associated with size, cost, reliability and complexity. Because in both prior art systems discussed pins are used which protrude perpendicularly from the connector, the profile of the connector is increased in the pin direction, detracting from the stackability of the connectors when employed in sets of more than one. Additionally, especially with respect to the header pin system, the cost per device is high because of the increased complexity of the device. The use of pins to effect an essentially mechanical connection also introduces reliability concerns. Good electrical contact must be insured with the manual insertion of each pin or with the shunting of each pair of pins for proper operation. Finally, the complexity of the devices, especially the header type connector, increases the probability of failure of the device.

There therefore exists a long felt need to provide a simple programmable connector which is inexpensive to produce, has minimal profile and is readily stackable, and which is reliable and easy to operate.

BRIEF SUMMARY OF THE INVENTION

In accordance with the present invention, a programmable connector is provided with programming regions which can be selectively activated using a conductive solution applied to the programming regions. The regions can be deactivated using a solvent or other material to remove the conductive solution.

Preferably, an array of programming regions is provided on a surface of the programmable connector, Each programming region is associated with a first conductor in connection with the burn-in tester and a second conductor in connection with the device under test. The first and second conductors have conductive portions which are electrically isolated from each other. A support region is disposed between the two portions, which support region serves to support the solution such that when the solution is applied to the programming region, it completes an electrical path between the conductive portions of the first and second conductors.

More preferably, the array of programming regions is in the form of an ordered matrix, with the pair of conductive portions of each programming portion being in the shape of two bars of an equal sign, making for easy visual recognition by the operator. Similarly, it is preferred that the conductive solution be visible, and be dispensed from a hand-held pen-type implement. Similarly, it is preferred that the solvent for removing the solution be dispensed from a hand-held pen-type "erasing" implement.

BRIEF DESCRIPTION OF THE SEVERAL VIEWS OF THE DRAWING(S)

Many advantages of the present invention will be apparent to those skilled in the art with a reading of this specification in conjunction with the attached drawings, wherein like reference numerals are applied to like elements and wherein:

FIG. 6 is a schematic view showing a shared pad arrangement in accordance with the invention; and FIG. 7 is a schematic view showing a dedicated pad arrangement in accordance with the invention.

DETAILED DESCRIPTION OF THE INVENTION

Figure 1:
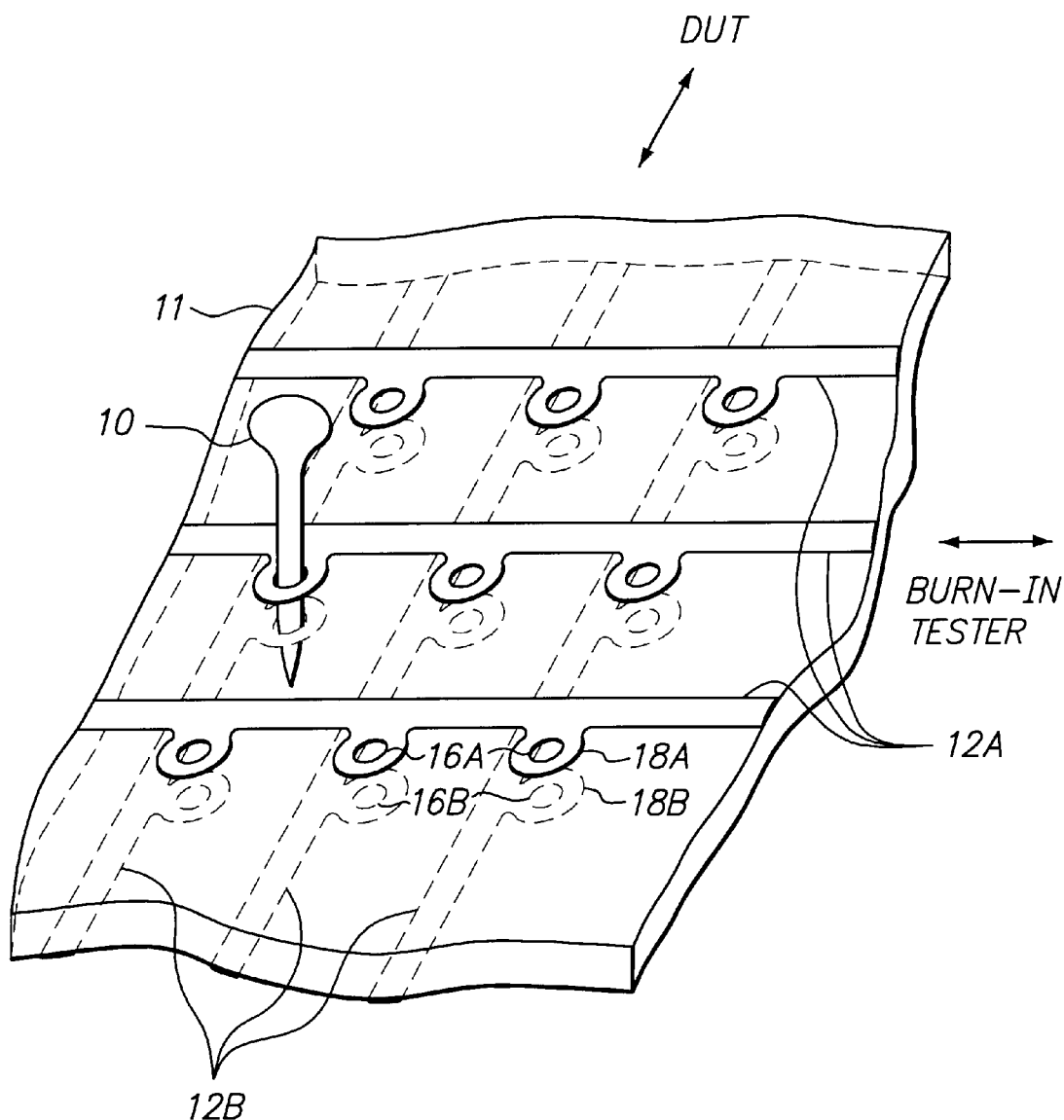
FIG. 1 is a schematic drawing showing a prior art programmable connector.

FIGS. 2–7 schematically show exemplary testing system and programmable connector in accordance with the present invention. The connector 20 operates as an interface between a device under test (DUT) such as packaged integrated circuit 32 which is mounted on a load board 36, and a burn-in tester 28 which issues test signals to and receives and monitors response signals from the DUT during the testing process. Two-way arrows 22 and 24 represent signal traffic between the devices.

Figure 2:
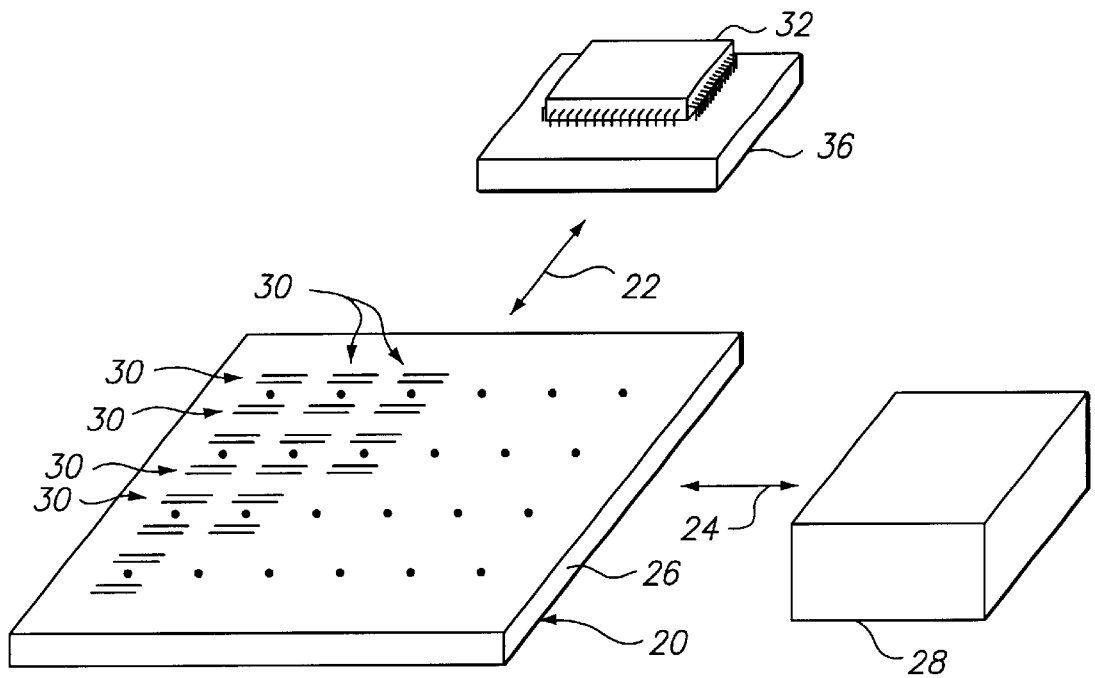
FIG. 2 is a schematic drawing showing a testing system in accordance with the invention.
Figure 4A:
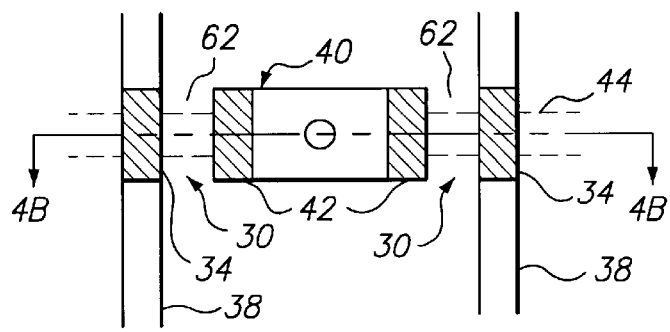
FIG. 4A is a top plan view of a pair of programming regions in accordance with the invention.
Figure 4B:
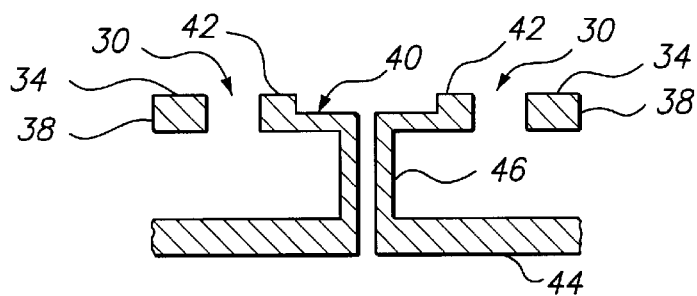
FIG. 4B is a cross-sectional view taken along line 4B—4B of 4A.
Figure 3:
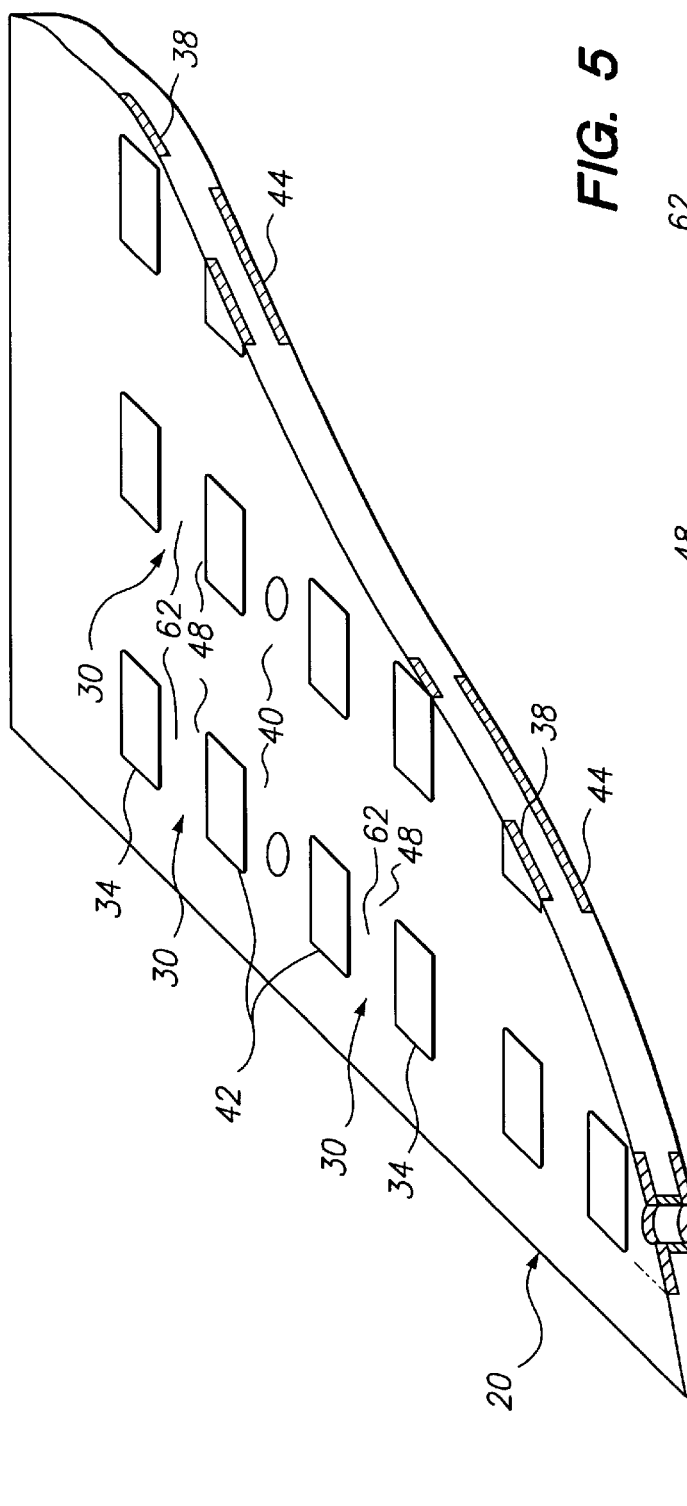
FIG. 3 is an isometric, partial cut-away view of a programmable connector in accordance with the invention.

As can be seen from FIGS. 2 and 3, connector 20 comprises generally an insulating substrate 26. On one surface of connector 20 is provided an array of programming regions 30. FIG. 3 details the layout of the programming regions 30 of FIG. 2. Each programming region 30 comprises a conductive portion 34 of a conductive trace 38 in confronting relationship with a conductive portion 42 of a pad 40, best seen in FIGS. 4A and 4B. Additionally, each programming region 30 comprises a support region 62, whose function is described below.

Traces 38 and pads 40, along with conductive portions 34 and 42, are all made of suitable metallic or other conductive materials readily formed on or embedded in substrate 26 in accordance with known circuit board fabrication techniques. Also provided on connector 20, on an opposite surface thereof or at least in substantial electrical isolation from conductive trace 38 is a conductive trace 44, also comprising suitable metallic or other conductive materials. Trace 38 is one of an array of such traces provided on or in connector 20, while trace 44 is also one of an array of similar traces provided in substantial isolation from traces 38. Although exemplarily these traces are shown to extend in substantially straight lines along opposite surfaces of connector 20 and orthogonally to each other, it is to be understood that other shapes and relative directions of the traces are contemplated. At least one of traces 38 is in electrical communication with burn-in tester 28, while at least one of traces 44 is in electrical communication with the DUT such as packaged integrated circuit 32, via load board 36. It is also contemplated that connector 20 and load board 36 may be integrally formed as one contiguous structure, rather than as discrete devices as exemplarily shown.

Preferably, but not necessarily, traces 38 are buried beneath the surface of the connector 20, with only the portions 34 thereof being exposed outside an insulating material, such as substrate 26 or other suitable non-conductive laminate or other layer (not shown), which forms the surface of the connector 20. In a similar manner, pads 40 are buried beneath the surface of substrate 26, with only portions 42 thereof being exposed. Portions 34 and 42 can be raised so as to protrude outwardly through the surface of connector 20. Alternatively, the material forming the surface, such as the laminate or other layer, can be etched away to define portions 34 and 42.

Traces 44 are preferably, but not necessarily, buried beneath the opposite surface of connector 20, which opposite surface is formed by substrate 26 itself or by a suitable non-conductive laminate or other layer (not shown). Traces 44 are in electrical communication with corresponding pads 40 (and conductive potions 42 thereof) through vias 46 extending through substrate 26 of connector 20. Vias 46 are formed through conventional printed circuit board fabrication methods, comprising a conductor-lined hole passing from the pad 40 to the trace 44, and providing a conductive path between a column of pads 40 and an associated trace 44. Other methods of connecting the pads 40 and traces 44, such as a transverse wire or trace, fall within the purview of the invention, although the use of vias may be economically more efficient.

Figure 5:
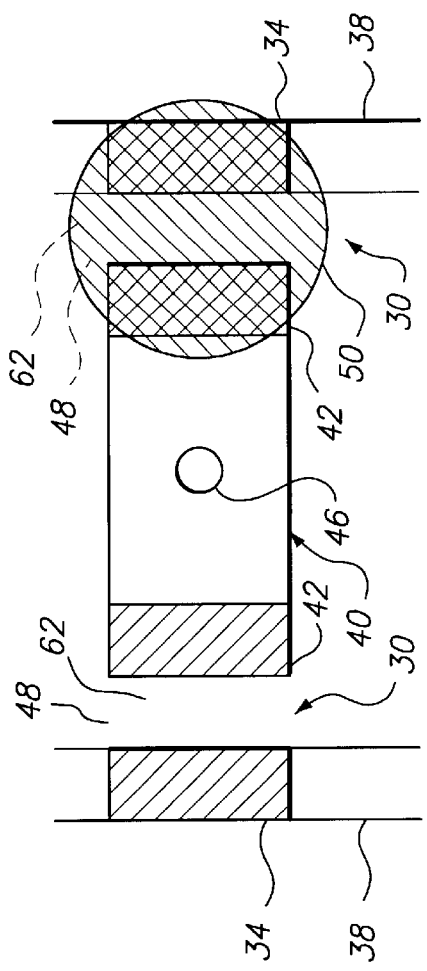
FIG. 5 is a top plan view of a pair of programming regions in which an one programming region is activated in accordance with the invention.

To program connector 20, an operator activates a programming region 30 by using a pliant conductive material, such as a solution dispensed in the form of an "ink" from a "pen," or pen-type device, to "write" a layer of material, shown in the form of a circle, or dot 50, over support region 62 of programming region 30 in FIG. 5. The written dot 50 of conductive ink bridges the gap 48 separating portions 34 and 42, closing a circuit path between the trace 38 of the portion 34 and the trace 44 corresponding to the portion 44. Support region 62 is made from non-conductive material extending from the portion 34 to portion 42. This non-conductive material may be the substrate 26 itself, or it may be a laminate or suitable layer which maintains electrical isolation between portions 34 and 42 preceding application of the pliant conductive material dot 50. It will be appreciated that although depicted as occupying a gap 48, support region 62 can take any desired shape as long as it functions to support the conductive solution in such a way as to permit the solution to close a circuit path between the portions 34 and 42.

By selectively writing in dots of conductive ink on connector 20, the operator achieves a specific routing configuration for the connector 20. This operation, it will be appreciated, is simple and can be performed accurately, with the operator being guided by the "equal sign" appearance of the pair of conductive portions 30. Of course, it will be appreciated that other shapes can be selected for the conductive portions 34 and 42, and the choice of the depicted rectangular bars forming the "equal sign" shape is merely one of aesthetics, facilitating easy identification and guidance for the operator during the programming operation. Depending on the particular DUT being tested, an appropriate conductive ink dot pattern can be formed on the connector 20 by writing in one or more dots in appropriate locations on the connector 20, thus achieving different routing configurations and customizing the DUT-burn-in tester 28 connection in accordance with the particular DUT configuration and the test to be performed thereon.

Pens for dispensing conductive solution, or ink, are known in the art and are available from for example Chemtronics™. These pens are self-contained, disposable, handheld tubular devices very much resembling a conventional ink pen writing instrument and containing a limited amount of conductive material dispensed through one end upon that end's contact with a surface, in this case the support region 62. The conductive ink comprises a suitable electrically conductive material which dries in place following application. Preferably, the ink is visible, providing the operator with visual feedback indicative of the propriety of the connection written and the configuration of the programmed connector. Additionally, the programming regions 30 can be deactivated if a mistake is made, or for purposes of reconfiguring the connector 20 for use with a different DUT or for performing a different test on the same DUT, as is contemplated. To deactivate a programming region 30, the conductive ink is removed, or "erased" from support region 62 of the programming region, using appropriate chemical solvents or similar materials. Known solvents or other materials, also dispensed from a pen-type device or sponged on or otherwise applied over the dots targeted for removal readily accomplish this.

For purposes of economy, in the above-described exemplary arrangement two conductive portions 42 share a single pad 40. Thus, as can be seen from FIG. 6, each pair of programming regions 30A and 30B involve three traces—38A, 38B and 44A, such that one or both traces 38A and 38B can be connected to trace 44A by application of conductive ink across gaps 48A and 48B. It is also possible that a dedicated system can be provided, as seen in FIG. 7, wherein each programming region 30C involves only two traces—38C and 44B, and only one connection, between traces 38C and 44B, can be made with the conductive ink bridging gap 48C between conductive portions 42A on pads 40A.

It will be appreciated that while the invention is described exemplarily in the context of a burn-in tester, limitation to this context is not intended. Rather, the teachings of the invention can be applied for any general electrical routing use, especially applications in which frequent or repeated reprogramming is required. The simplicity of programming and reprogramming the system of the invention readily lend to such applications.

The above are exemplary modes of carrying out the invention and are not intended to be limiting. It will be apparent to one of ordinary skill in the art that modifications thereto can be made without inventive departure from the spirit and scope of the invention as set forth in the claims below.

What is claimed is:

1. A programmable connector for selectively connecting a device under test to a burn-in tester, the programmable connector being adapted to withstand elevated burn-in testing temperatures and comprising:
   a plurality of programming regions each comprising:
      a second conductive portion for electrical connection to the burn-in tester; and
      a support region adapted to support a conductive solution for electrically connecting together the first and second conductive portions,
   wherein the support region and the first and second conductive portions are provided at a first surface of the programmable connector, and wherein the conductive solution is selectively applicable and selectively removable such that different routing configurations between the device under test and the burn-in tester are realizable using the programmable connector.

2. The programmable connector of claim 1, further comprising a first trace in electrical contact with either one of the device under test and the burn-in tester and a second trace in electrical contact with the other of the device under test and the burn-in tester, wherein the first conductive portion of at least one programming region is in electrical contact with the first trace and the second conductive portion of the at least one programming region is in electrical contact with the second trace.

3. The programmable connector of claim 2, further comprising a pad in electrical contact with the second conductive portion and the second trace.

4. The programmable connector of claim 3, further comprising a via for establishing the electrical contact between the pad and the second trace.

5. The programmable connector of claim 3, wherein the pad is in electrical contact with the second conductive portion of more than one programming region.

6. The programmable connector of claim 1, wherein the first and second portions of the programming region comprise confronting markings separated by the support region and disposed on a first surface of a printed circuit board.

7. The programmable connector of claim 1, wherein the support region is of non-conducting material.

8. The programmable connector of claim 1, wherein the conductive solution dries following application at the support region.

9. A testing system for selectively connecting a burn-in tester to a device under test, the testing system comprising:
   a burn-in tester adapted to provide elevated burn-in testing temperatures;
   a programmable connector electrically connected to the burn-in tester, the programmable connector comprising:
      at least one first conductor having a first conductive portion and connected to the burn-in tester;
      at least one second conductor having a second conductive portion and adapted for connection to the device under test; and
      a support region adapted to support a conductive solution for electrically connecting together the first and second conducting portions,
   wherein the support region and the first and second conductive portions are provided at a first surface of the programmable connector.

10. The testing system of claim 9, further comprising a dispenser for dispensing the conductive solution onto the support region.

11. The testing system of claim 9, wherein the conductive solution dries following application at the support region.

12. A method for selectively routing electrical signals between a device under test and a burn-in tester used in burn-in testing under elevated temperature conditions, the method comprising:
   providing a array of programming regions, each programming region having a first conductive portion electrically connected to the device under test and a second conductive portions being provided at a first surface;

causing one or more programming regions to become activated to thereby achieve a first routing configuration of activated programming regions, wherein the step of causing a programming region to become activated comprises electrically connecting together the first and second portions of the programming region by applying a conductive solution between the first and second conductive portions.

13. The method of claim 12, further comprising the step of achieving a second routing configuration different from the first routing configuration by activating at least one programming region different from a programming region of the first configuration.

14. The method of claim 12, further comprising the step of achieving a second routing configuration different from the first routing configuration by deactivating at least one activated programming region, the step of deactivating comprising removing the conductive solution between the first and second conductive portions.

15. The method of claim 14, wherein the step of deactivating comprises applying a solvent to the conductive solution.

16. The method of claim 15, wherein the solvent is applied using a pen-type dispenser.

17. The method of claim 12, wherein the step of causing a programming region to become activated comprises applying conductive ink from a pen-type device to thereby connect the first and second portions.

18. The method of claim 17, wherein the conductive ink is visible.

19. The method of claim 18, wherein the conductive ink dries in place after application.

\* \* \* \* \*